(12) United States Patent
Strogies et al.

(10) Patent No.: US 11,373,984 B2
(45) Date of Patent: Jun. 28, 2022

(54) POWER MODULE HAVING A POWER ELECTRONICS DEVICE ON A SUBSTRATE BOARD, AND POWER ELECTRONICS CIRCUIT HAVING SUCH A POWER MODULE

(71) Applicant: Siemens Aktiengesellschaft, Munich (DE)

(72) Inventors: Jörg Strogies, Berlin (DE); Klaus Wilke, Berlin (DE); Bernd Müller, Falkenberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/046,974

(22) PCT Filed: Apr. 17, 2019

(86) PCT No.: PCT/EP2019/059879
§ 371 (c)(1),
(2) Date: Oct. 12, 2020

(87) PCT Pub. No.: WO2019/201972
PCT Pub. Date: Oct. 24, 2019

(65) Prior Publication Data
US 2021/0151417 A1    May 20, 2021

(30) Foreign Application Priority Data
Apr. 17, 2018   (EP) .................................... 18167698

(51) Int. Cl.
*H01L 25/07*   (2006.01)
*H01L 23/367*  (2006.01)
(Continued)

(52) U.S. Cl.
CPC ........ *H01L 25/074* (2013.01); *H01L 23/3672* (2013.01); *H01L 23/48* (2013.01);
(Continued)

(58) Field of Classification Search
CPC ... H01L 25/074; H01L 23/3672; H01L 23/48; H01L 23/49827; H01L 23/49838; H01L 25/072
See application file for complete search history.

(56) References Cited

U.S. PATENT DOCUMENTS 7,030,317 B1      4/2006  Oman .......................... 174/52.4
2008/0054439 A1*  3/2008  Malhan ................... H01L 25/18
                                                          257/690

(Continued)

FOREIGN PATENT DOCUMENTS

DE   11 2014 002061   1/2016  .......... H01L 24/473
EP       3 104 412   12/2016  .............. H01L 25/11
(Continued)

OTHER PUBLICATIONS

DE 11 2014 002061, U.S. 2016 0064302
(Continued)

Primary Examiner — Nicholas J Tobergte
(74) Attorney, Agent, or Firm — Slayden Grubert Beard PLLC

(57) ABSTRACT

Various embodiments include a power module comprising: a first power electronics device arranged on a first substrate board; and a second power electronics device mounted on a second substrate board. The first substrate board, the first device, the second substrate board, and the second device are arranged on a first baseplate stacked above one another or in planar fashion beside one another.

13 Claims, 4 Drawing Sheets

(51) Int. Cl.
*H01L 23/48* (2006.01)
*H01L 23/498* (2006.01)

(52) U.S. Cl.
CPC .. *H01L 23/49827* (2013.01); *H01L 23/49838* (2013.01); *H01L 25/072* (2013.01)

(56) References Cited

U.S. PATENT DOCUMENTS

| | | | |
|---|---|---|---|
| 2012/0243192 A1* | 9/2012 | Robert | H01L 23/3735 |
| | | | 361/767 |
| 2013/0147027 A1* | 6/2013 | Ha | H01L 23/49833 |
| | | | 257/706 |
| 2014/0008781 A1* | 1/2014 | Nishi | H01L 24/36 |
| | | | 257/691 |
| 2016/0064302 A1 | 3/2016 | Yamada | H01L 23/3675 |
| 2018/0040593 A1 | 2/2018 | Zhou | H01L 25/071 |
| 2019/0221506 A1* | 7/2019 | Yeo | H01L 23/49551 |

FOREIGN PATENT DOCUMENTS

| | | | |
|---|---|---|---|
| EP | 3 107 120 | 12/2016 | H01L 25/11 |
| WO | 2015 005181 | 1/2015 | H01L 25/07 |

OTHER PUBLICATIONS

Search Report for International Application No. PCT/EP2019/059879, 31 pages, dated Jul. 26, 2019.
Search Report for EP Application No. 18167698.2, 23 pages, dated Oct. 29, 2018.

* cited by examiner

POWER MODULE HAVING A POWER ELECTRONICS DEVICE ON A SUBSTRATE BOARD, AND POWER ELECTRONICS CIRCUIT HAVING SUCH A POWER MODULE

CROSS-REFERENCE TO RELATED APPLICATIONS

This application is a U.S. National Stage Application of International Application No. PCT/EP2019/059879 filed Apr. 17, 2019, which designates the United States of America, and claims priority to EP Application No. 18167698.2 filed Apr. 17, 2018, the contents of which are hereby incorporated by reference in their entirety.

TECHNICAL FIELD

The present disclosure relates to power modules. Various embodiments include a first power electronics device mounted on a first substrate board and/or a power electronics circuit having a multiplicity of power modules.

BACKGROUND

Power electronics circuits normally need to be adapted for an associated given application. These applications differ individually, resulting in considerable outlay for the design of the power electronics circuits and for the manufacture thereof. The individual applications are an obstacle in particular to the manufacture of power modules being automatable.

SUMMARY

Various embodiments of the teachings of the present disclosure include power modules and/or power electronics circuits, wherein the power module is intended to allow the production of power electronics circuits with decreased outlay for the design and the manufacture, in particular for special orders of power modules and small numbers. For example, some embodiments include a power module (11) having a first power electronics device (31) arranged on a first substrate board (12), characterized in that there is provision for a second power electronics device (32) mounted on a second substrate board (13), wherein the first substrate board (12), the first device (31), the second substrate board (13) and the second device (32) are arranged on a first baseplate in a manner stacked above one another and/or in planar fashion beside one another.

In some embodiments, a top of the second device (32) is electrically connected to a bottom of the first substrate board (12).

In some embodiments, the second device (32) is contact-connected to the first device (31) via an electrical connecting path.

In some embodiments, the electrical connecting path is in the form of a plated-through hole in the first substrate board (12), in particular in the form of a via.

In some embodiments, the electrical connecting path is embodied as a half-bridge (64) providing a phase contact (48).

In some embodiments, the first substrate board (12) and the second substrate board (13) have at least one distance piece (17) arranged between them that connects the first substrate board (12) and the second substrate board (13) to one another.

In some embodiments, the at least one distance piece (17) is embodied in electrically conductive fashion and is connected to electrical conductor tracks on the first substrate board (12) and the second substrate board (13).

In some embodiments, the first substrate board (12) is connected to a second baseplate (19).

In some embodiments, a top of the first device (31) is connected to a first baseplate (18).

In some embodiments, the first substrate board (12) and the first baseplate (18) have at least one distance piece (17a) arranged between them that connects the first substrate board (12) and the first baseplate (18) to one another.

In some embodiments, the at least one distance piece (17a) is embodied in electrically conductive fashion and is connected to electrical conductor tracks on the first substrate board (12) and the first baseplate (18).

In some embodiments, the first baseplate (18) and/or the second baseplate (19) has/have a cooling structure (21, 22).

As another example, some embodiments include a power electronics circuit having a multiplicity of power modules, in particular converters, characterized in that the power modules (11) are designed as described above and the power modules (11) are electrically connected by a baseplate in each case.

In some embodiments, the power modules (11) have two power electronics devices (31) each in the form of a first switching element and in the form of a second switching element, wherein the first switching element and the second switching element are merged to form a common power connection, in particular a phase contact (48), and the first switching element has a first power connection embodied as a positive pole (46) and the second switching element has a second power connection embodied as a negative pole (47).

In some embodiments, the power modules (11) are divided into three groups, each having an identical number of power modules (11), wherein the first power connections of all of the switching elements are electrically connected to one another and form a common negative pole (47m), the second power connections of all of the switching elements are electrically connected to one another and form a common positive pole (46p), and the common power connections in each of the three groups are electrically connected to one another and form three common power connections having one common phase contact (48a, 48b, 48c) each.

BRIEF DESCRIPTION OF THE DRAWINGS

The embodiments described below are only exemplary embodiments of the teachings herein. In the exemplary embodiments, the described components of the embodiments in each case constitute individual features of the teachings which should be considered independently of one another and which develop the teachings in each case also independently of one another and should thus also be regarded as part of the disclosure individually or in a different combination than that shown. Furthermore, the embodiments described can also be supplemented by further features of the teachings herein from among those already described. In the drawings.

DETAILED DESCRIPTION

Figure 1:
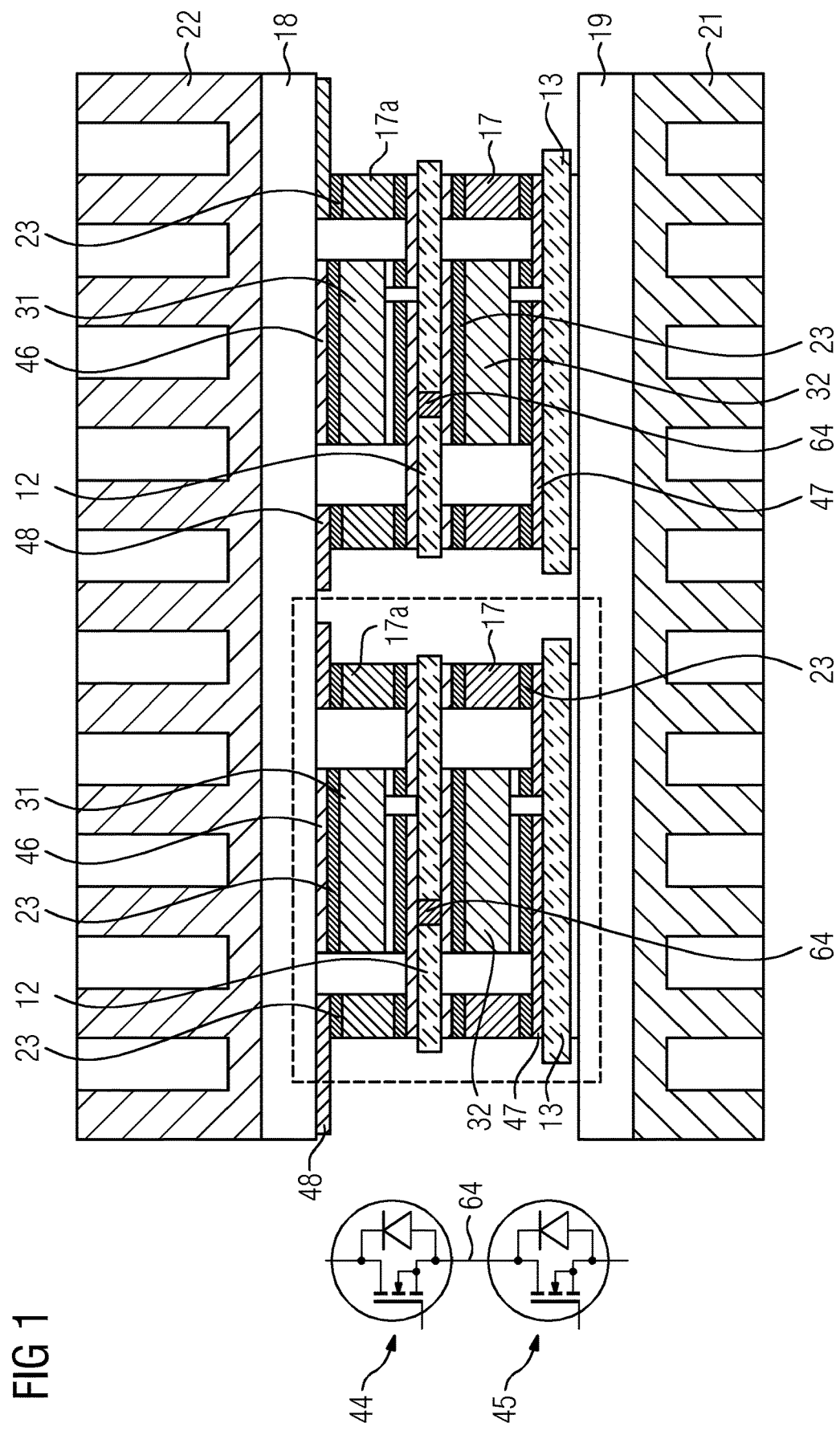
FIG. 1 shows an exemplary embodiment of a power module incorporating teachings of the present disclosure as a side view.

Various embodiments of the teachings herein include a power module with a second power electronics device mounted on a second substrate board, wherein the first substrate board, the first device, the second substrate board and the second device form a stack and/or a planar arrangement—possibly the stack. This allows the power electronics devices to be arranged in a very space-saving manner. Additionally, a power electronics device and the associated substrate board can in each case form a power electronics unit—referred to as "basic unit" and hence the smallest form of the power module below—which can be preassembled, so that the power module can easily be adapted for different applications by stacking and/or butt-mounting said basic units. The assembly of multiple basic units, that is to say for example the stack, can then furthermore be preassembled in order to construct power electronics circuits having different numbers of stacked and/or butt-mounted modules. The use of a high proportion of identical parts means that it is possible to scale the power modules for different applications without appreciable outlay.

In some embodiments, a top of the second device may be electrically connected to a bottom of the first substrate board. The terms "top" and "bottom" are not dependent on an installation orientation or positioning of the power module during operation in this case. Rather, the devices are surface mounted devices, these devices usually being mounted on the top of a substrate, specifically by the bottom of the device. Hence, regardless of the installation orientation of the power module, a reference point is obtained as a result of the surface mounting, said reference point also being used to define "top" and "bottom" below.

An electrical connection from the top of the second device to a bottom of the first substrate board allows the device used to communicate electrically both with the first substrate board via the top of the device and with the second substrate board via the bottom of said device. In other words, a device that has electrical contact areas both on its top and on its bottom can be used. This allows in particular power electronics devices having extensive contact areas to be contact-connected, which permits the conduction of larger currents and additionally improves heat dissipation for heat loss.

In some embodiments, the second device may be contact-connected to the first device via an electrical connecting path. By providing an electrical connecting path of this kind, it is possible for the first device and the second device to communicate with one another. This allows additional applications when designing the electrical circuit produced by the power module, since electrical interconnection of the devices directly is possible.

In some embodiments, the electrical connecting path between the first device and the second device can be in the form of a plated-through hole, in particular in the form of a via. This allows particularly direct contact connection, the devices on either side of the first circuit carrier thus being mounted on the top and the bottom of the substrate board. The plated-through hole then leads to an electrical connection between the devices on the shortest possible path. This allows larger currents to flow between the devices with low losses, which allows an efficiently operating power electronics circuit to be designed.

In some embodiments, the electrical connecting path may comprise a half-bridge providing a phase contact. This allows for example a power electronics circuit to be produced (using multiple other power modules simultaneously) in which a DC current is converted into a single-phase or polyphase AC current. The phase contacts provide a connection option in this instance so that the AC current can be delivered by the power module or an electrical circuit produced by means of the power modules. This allows power electronics circuits having a high power density per unit volume to be manufactured.

In some embodiments, the first substrate board and the second substrate board have at least one distance piece arranged between them that connects the first substrate board and the second substrate board to one another. This allows the power module to be rendered mechanically robust in addition. Furthermore, the distance pieces can also serve as spacers in order to realize defined electrical contact connection for the electronic devices.

In some embodiments, the distance pieces have electrical conductivity paths and are produced such that they
  provide mechanical robustness and are electrically conductive and/or
  cover and/or represent signal and/or power paths, and/or
  provide some or all of the electrical potentials on all levels In some embodiments, distance pieces can furthermore also be arranged, with the same technical effect(s) or somewhat the same technical effect(s), between the first substrate board and a first baseplate, a top of the first device also being connected to the first baseplate. The first baseplate can advantageously additionally serve as a circuit carrier in this case.

In some embodiments, said distance pieces to be embodied in electrically conductive fashion. This allows the at least one distance piece to electrically conductively connect conductor tracks on the first substrate board and on the first baseplate to one another. Equally, the first substrate board and the second substrate board can be electrically conductively connected to the distance pieces, with conductor tracks that are on the substrate boards being able to be connected to one another in this case too. Electrically conductive distance pieces therefore allow more complex interconnection of the devices among one another, which advantageously increases the creative freedom for producing power electronics circuits. The power modules can therefore be designed for tight spaces and perform a wide variety of electrical tasks.

In some embodiments, the first baseplate and/or the second baseplate may have a cooling structure. This allows the heat produced in power electronics circuits to be dissipated reliably and quickly during operation. The high level of compactness of the power module means that it is advantageous to connect the cooling structures directly to the base plates, resulting in short transmission paths for the heat to be dissipated. The cooling structure can consist of a ribbed radiator, for example, which is connected to the applicable baseplate or forms a common component therewith (single-piece manufacture).

In some embodiments, the power module can be combined with power modules of the same design to produce power electronics circuits whose function can be adapted for different applications with little outlay. In particular, connection of multiple power modules in parallel allows the power electronics circuit produced by the power modules to be adapted for different demanded power ranges.

In some embodiments, there is a power electronics circuit in which the power modules described are used, wherein multiple power modules are electrically connected by merging in each case. The power electronics circuit thus produced can be produced using a multiplicity of identical parts on account of the modular design, advantageously minimizing the outlay for production. Additionally, it is also possible for the power electronics circuit to be disassembled using simple means. It is thus possible for example to replace faulty power modules with little outlay.

In some embodiments, the power modules have two power electronics devices each in the form of a first switching element and in the form of a second switching element. In other words, one electronic device is in the form of a first switching element and the second electronic device is in the form of a second switching element. The first switching element and the second switching element are merged to form a common power connection, which in particular can form a phase contact for a phase of a three-phase electric current. A common power connection of this kind is also referred to as a half-bridge. The first switching element furthermore has a first power connection embodied as a positive pole and the second switching element has a second power connection embodied as a negative pole. This allows the power connection to be alternately switched to the negative pole and the positive pole by the switching elements, allowing an AC current to be produced. The power electronics circuit can therefore advantageously be operated as a frequency converter of modular design.

In some embodiments, the power modules may be divided into three groups, each having an identical number of power modules, wherein the common power connections in each of the three groups are electrically connected to one another and form three common power connections having one common phase contact each. This circuit can therefore advantageously be used to produce a three-phase current, the interconnection of the power modules to form groups also permitting larger currents to be switched. The number of power modules connected in parallel is such that the required current can be switched. So that the power modules can also be supplied with a DC voltage, the first power connections of all of the switching elements need to be electrically connected to one another and to form a common negative pole, while the second power connections of all of the switching elements are likewise electrically connected to one another in order to form a common positive pole.

In some embodiments, the power modules may be connected in series. This is accomplished by connecting the basic units in a suitable manner, in this regard see FIG. 1, allowing a series connection and hence a branch of an inverter to be generated. These units are designed such that a series connection can easily be produced by stacking and therefore presents considerable opportunities for variation.

In some embodiments, there can be a combination of parallel and series connection. This is the case for example if there are two or more basic units in a stacked arrangement and these stacks are then connected in a butt-mounted arrangement. The respective stacks then produce a series connection, for example, and the butt-mounted arrangement of the series-connected stacks of basic units produces a parallel connection.

In some embodiments, the electrical connection of the common power connections may be formed by a first electrical connection and a second electrical connection in each case. This configuration is easy to assemble by virtue of the power modules being arranged in rows one after the other, which automatically produces the electrical connection.

In some embodiments, the power electronics devices may comprise naked chips. This can be contact-connected directly to the substrate board, for example by means of a sintered joint, which also ensures electrical contact. The substrate board may be manufactured from a ceramic. This does not conduct the electric current, which means that electrical insulation is ensured at the same time. An electronic circuit can thus be produced by patterning an electrically conductive coating on the substrate board. This provides for example contact areas for contact-connecting the power electronics devices.

Further details of the teachings herein are described below with reference to the drawings. Identical or mutually corresponding drawing elements are each provided with the same reference signs and are explained repeatedly only insofar as differences arise between the individual figures.

FIG. 1 depicts a power module 11 (system boundaries are shown in dashes), there also being a depiction of how multiple power modules can be combined to produce a power electronics circuit. The power module 11 consists of a first device 31 and a second device 32, which are embodied as a first transistor 44 and a second transistor 45, respectively. These can form—in particular if connected in series as in this instance—a circuit having a half-bridge 64, the circuit being indicated in FIG. 1 and being explained in even more detail below with reference to FIG. 3.

The first device 31 and the second device 32 are mounted on a first substrate board 12 and a second substrate board 13, respectively. This involves the use of various conductor tracks on the first substrate board 12 and the second substrate board 13. Furthermore, the second substrate board 13 is mounted on a second baseplate 19, electrical contact connection being able to take place in this case too, as indicated in FIG. 1. The first device 31 is likewise electrically contact-connected via a first baseplate 18.

In order to implement a circuit, there is furthermore provision for distance pieces 17, 17a, which allow electrical contact connection between the individual boards, i.e. the first substrate board 12, the second substrate board 13, the first baseplate 18 and the second baseplate 19. This allows electrical contact connection among conductor tracks provided on these boards. The electrical contact connection is effected by means of solder joints 23, only some of which have been provided with reference signs in FIG. 1 for illustrative purposes.

The various conductor tracks form a positive pole 46, a negative pole 47 and a phase contact 48, as shown in FIG. 1. The positive pole 46 and the negative pole 47 can have a DC voltage applied to them. An AC voltage can then be tapped off via the phase contact 48. The power module 11 shown in FIG. 1 can therefore be used as a converter. The operation of this converter is explained in more detail with reference to FIG. 3.

The half-bridge 64 is provided as a plated-through hole in the first substrate board 12. This has the advantage that the first device 31 and the second device 32 can be contact-connected to one another very directly, which means that short electrical paths are produced. The tap of the phase contact can then be provided via a conductor track on the first substrate board 12.

The first baseplate 18 and the second baseplate 19 furthermore have cooling structures 21, 22 produced on them, which are in the form of ribbed radiators. In this way, the heat produced in the first electronic device 31 and the second electronic device 32 can be dissipated via the two substrate boards 12, 13 and baseplates 18, 19 in each case. The short paths allow effective cooling in this instance.

FIG. 1 furthermore clearly reveals that the smallest unit requiring prefabrication—the basic unit—for modular manufacture of the power modules is in each case the assembly comprising a substrate board 12, 13 and a device 31, 32 and possibly also the distance pieces 17, 17a. A basic unit of this kind, embodied as a chip/ceramic assembly (CCA for short) for illustrative purposes, can be manufactured in large numbers. Stacking these basic units results in a series connection and/or parallel connection being implemented. The substrate board can consist of a ceramic, for example, which is fitted with a multiplicity of devices. The respective CCAs can subsequently be singularized for example by separating the substrate board.

Following assembly, the design concept affords the opportunity to hermetically seal the relevant installation space (see FIG. 1; a seal can be provided circumferentially in this instance). A seal would then span the gap between the baseplates 18, 19, which would produce the installation space (not depicted). This allows advantages to be generated for the insulation strategy (in particular vacuum and gases) and use under critical ambient conditions (in particular moisture, noxious gas, etc.). The design concept also affords the opportunity to integrate sensors (not depicted) for e.g. temperature and current.

Figure 2:
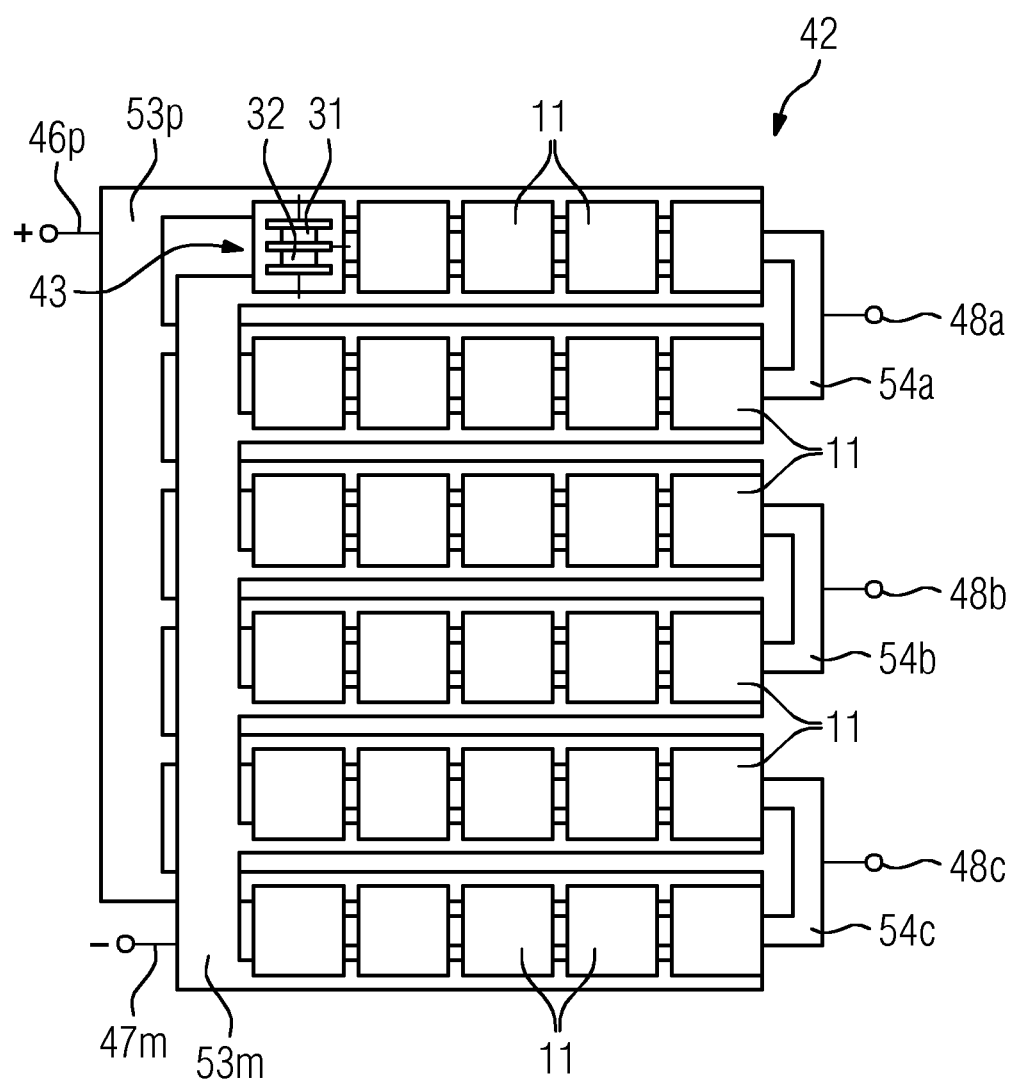
FIG. 2 shows a power electronics circuit having a multiplicity of power modules, which may be designed as shown in FIG. 1 or similarly, as a simplified block diagram.

FIG. 2 depicts how multiple power modules 11 as shown in FIG. 1 can be combined to produce a power electronics circuit 42. Five power modules 11 in each case are configured in a row 43, there being provision for six rows in total. As FIG. 1 reveals, there is a possibility of contact connection for both devices, that is to say the first device 31 and the second device 32, this possibility being realized for each power module 11 in FIG. 2 and being schematically depicted as a circuit diagram in FIG. 3.

Figure 3:
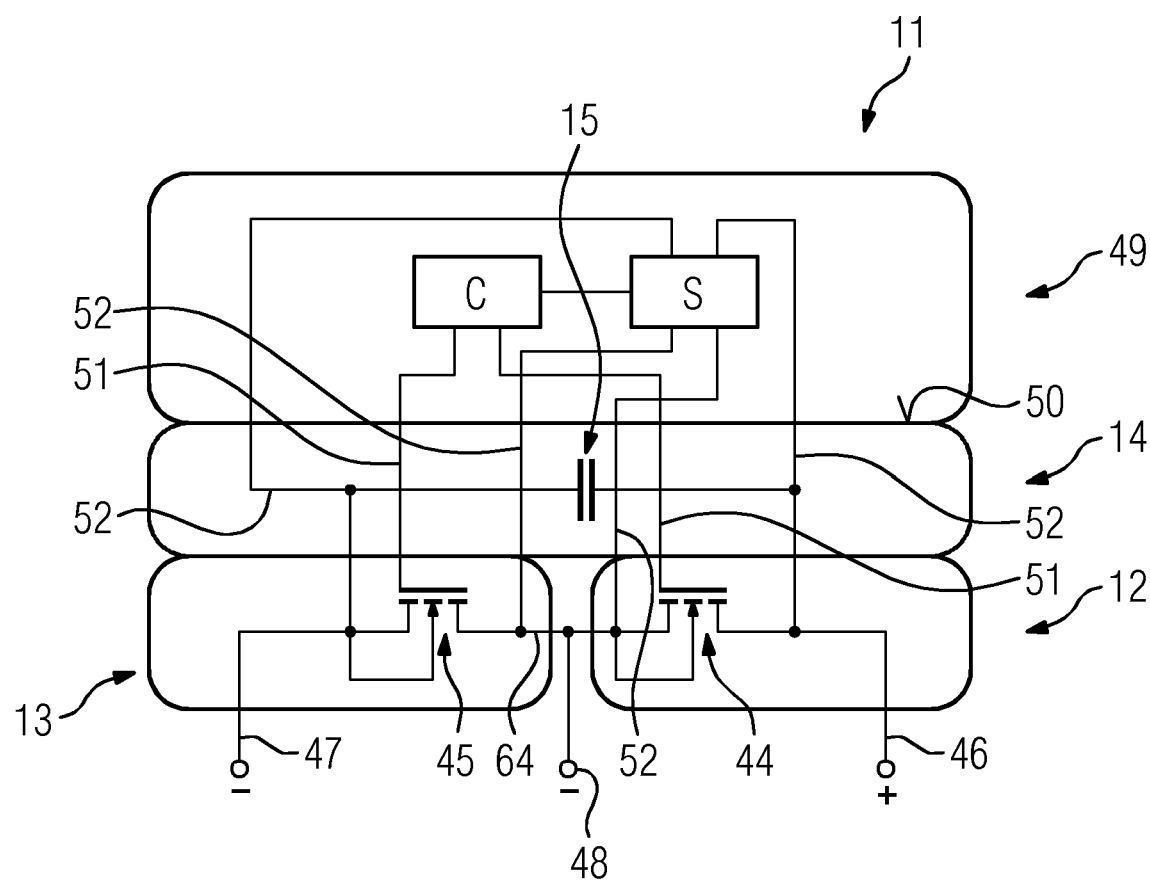
FIG. 3 schematically shows a circuit diagram for contact connection of power modules as shown in FIG. 1 in a power electronics circuit as shown in FIG. 2.

FIG. 3 depicts a capacitor 15 to complete the circuit. This serves to simplify the depiction, a multiplicity of capacitors connected in parallel also being able to be used as an alternative. The capacitor 15 shown in FIG. 3 is depicted merely schematically. The same applies to the first substrate board 12 and the second substrate board 13 and also the power electronics devices mounted on these, which are formed by a first transistor 44 and a second transistor 45. The first transistor 44 has its source electrode connected to the positive pole 46, also referred to as the high side, while the second transistor 45 has its drain electrode connected to the negative pole 47, also referred to as the low side. The drain electrode of the first transistor 44 and the source electrode of the second transistor 45 are connected to one another, this resulting in a half-bridge 64 having a phase contact 48. To control the power module 11, the capacitor 15 is provided with a driver circuit 49.

The driver circuit 49 shown in FIG. 3 is depicted schematically, in order to describe the operation thereof in principle. The driver circuit has a controller function C and a sensor function S. The controller function is ensured by contact lines 51 as an interface to the gate electrodes of the first transistor 44 and the second transistor 45. It is thus possible for the driver circuit to control both transistors as switches more intelligently. The information required for this operation is provided by the sensor function S. The sensor function is ensured via signal lines 52, which can be used to tap off a flow of current upstream and downstream of the capacitor 15 and upstream and downstream of the phase contact 48 in the half-bridge 64.

The capacitor 15 is connected to the positive pole 46 and the negative pole 47 and therefore performs a smoothing function required for polyphase operation of the power electronics circuit 42 shown in FIG. 1.

As FIG. 2 reveals, the power electronics circuit 42 shown in FIG. 2 is of modular design. By means of the circuit produced by the power modules 11 shown in FIG. 3, said power modules can be used jointly in each of three groups in order to produce a three-phase AC voltage, which can be tapped off at the common phase contacts 48a, 48b, 48c, from a DC voltage applied to the common positive pole 46p and to the common negative pole 47m. The level of the maximum current to be switched determines how many of the power modules 11 need to be used per phase. As shown in FIG. 2, this is ten power modules 11 per phase in each case. Hence, a circuit as shown in FIG. 3 is implemented for each of the power modules 11, each group of power modules 11 being connected in parallel.

Figure 4:
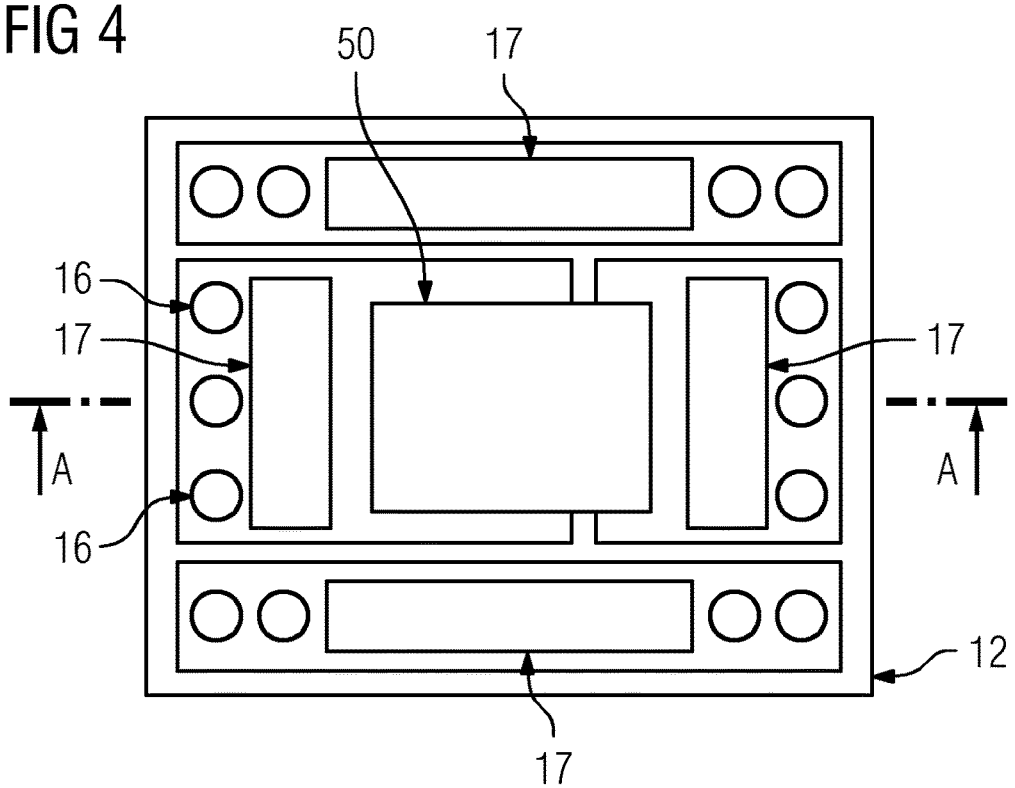
FIG. 4 shows a plan view of a stack comprising two basic units.

FIG. 4 shows a plan view of an illustrative embodiment of the teachings herein, showing a power module 11 from above. It is possible to see the top basic unit of a stack, comprising a substrate board 12, 13 with solder joints 23 thereon that surround the device 31, for example a power chip 50. The power chip 50 is usable as a drain electrode, for example; in the depiction shown here, it is surrounded by four distance pieces 17, which are used for potential feedback. Potential feedback is used so that all of the electrical connections—also referred to as "potentials"—of the mounted semiconductor devices are present in each plane, top and bottom, that is to say are tappable and contact-connectable. This means that the full functionality is available in each wiring plane, so that stacking and/or butt-mounting of the "basic units" is possible.

The "basic units" form unit cells and are assembled as prefabricated units, tested in isolation, to form an overall system. The variable component-fitting that this allows results, during assembly, in maximum flexibility paired with maximum surface area use, which uses the available surface area by stacking and/or butt-mounting the basic units, as required. Furthermore, production of the basic units is suitable for mass production with all the advantages that mass production entails.

FIG. 4 also shows the sectional plane A-A. A depiction of the section through this plane A-A is shown in FIG. 5.

Figure 5:
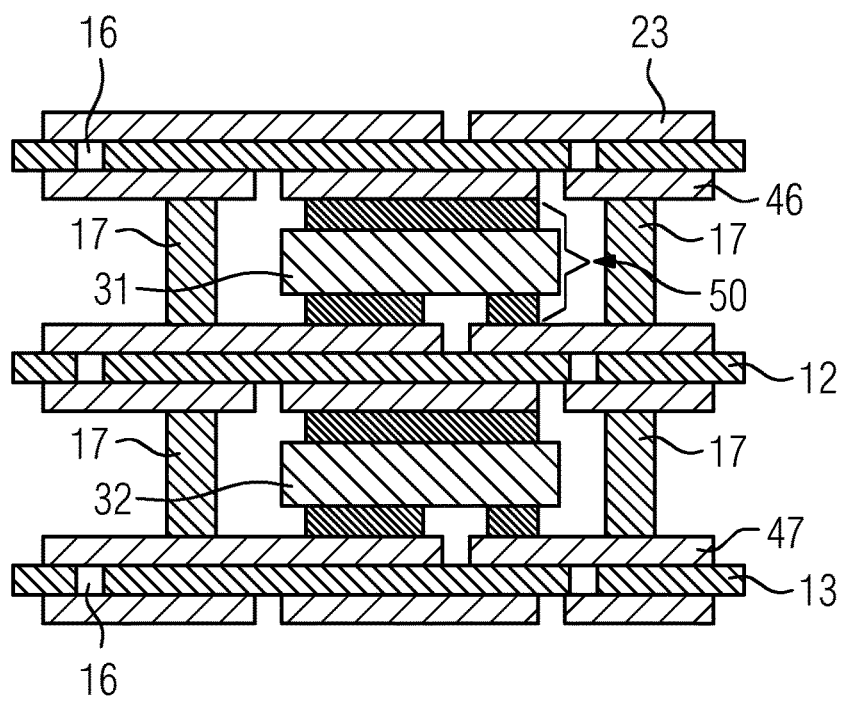
FIG. 5 shows a section along the line A-A from FIG. 4.

FIG. 5 depicts a stack comprising two basic units that form a power module 11, for example. Each of these basic units comprises a device 31, 32, a substrate board 12, 13, various solder joints 23 and distance pieces 17 in each case. The distance pieces 17 are used not only for providing mechanical robustness but optionally also for potential feedback, as described above.

LIST OF REFERENCE SIGNS 11 power module
12 first substrate board
13 second substrate board
15 capacitor
16 plated-through hole
17 distance piece
18 first baseplate
19 second baseplate
20 contact structure
21 cooling structure
22 cooling structure
23 solder joint
31 first device 32 second device
42 power electronics circuit
44 first transistor
45 second transistor
46 positive pole
47 negative pole
48 phase contact
49 driver circuit
50 power chip
51 contact line
52 signal line
64 half-bridge

What is claimed is:

1. A power module comprising:
a first power electronics device arranged on a first substrate board;
a second power electronics device mounted on a second substrate board;
wherein the first substrate board, the first device, the second substrate board, and the second device are arranged on a first baseplate stacked above one another or in planar fashion beside one another; and
a rigid distance piece between the first substrate board and the second substrate board, the distance piece fixing the first substrate board and the second substrate board at a predetermined distance from one another;
wherein the rigid distance piece is electrically conductive and connected to electrical conductor tracks on both the first substrate board and the second substrate board.

2. The power module as claimed in claim 1, wherein a top of the second device is electrically connected to a bottom of the first substrate board.

3. The power module as claimed in claim 2, wherein the second device is contact-connected to the first device via an electrical connecting path.

4. The power module as claimed in claim 3, the electrical connecting path comprises a plated-through hole in the first substrate board.

5. The power module as claimed in claim 3, wherein the electrical connecting path comprises a half-bridge providing a phase contact.

6. The power module as claimed in claim 1, further comprising a second baseplate connected to the first substrate board.

7. The power module as claimed in claim 1, wherein a top of the first device is connected to the first baseplate.

8. The power module as claimed in claim 7, further comprising a second distance piece connecting the first substrate board to the first baseplate.

9. The power module as claimed in claim 8, wherein the second distance piece is electrically conductive and connected to electrical conductor tracks on the first substrate board and the first baseplate.

10. The power module as claimed in claim 6, wherein the first baseplate and/or the second baseplate includes a cooling structure.

11. A power electronics circuit comprising:
a multiplicity of power modules, wherein each of the multiplicity of power modules comprises:
a first power electronics device arranged on a first substrate board;
a second power electronics device mounted on a second substrate board;
wherein the first substrate board, the first device, the second substrate board, and the second device are arranged on a baseplate stacked above one another or in planar fashion beside one another; and
a rigid distance piece between the first substrate board and the second substrate board, the distance piece fixing the first substrate board and the second substrate board at a predetermined distance from one another;
wherein neighboring power modules are connected to one another through the respective baseplates.

12. The power electronics circuit as claimed in claim 11, wherein each of the multiplicity of power modules includes two switching elements;
wherein the two switching elements are merged to form a common power connection; and
a first of the two switching elements has a positive pole and a second of the two switching elements has a negative pole.

13. The power electronics circuit as claimed in claim 12, wherein the power modules are divided into three groups, each having an identical number of power modules, wherein:
the first power connections of all of the switching elements are electrically connected to one another and form a common negative pole;
the second power connections of all of the switching elements are electrically connected to one another and form a common positive pole; and
the common power connections in each of the three groups are electrically connected to one another and form three common power connections having one common phase contact each.

* * * * *